US011764152B1

(12) United States Patent
Kondo et al.

(10) Patent No.: US 11,764,152 B1
(45) Date of Patent: Sep. 19, 2023

(54) SEMICONDUCTOR DEVICE HAVING L-SHAPED CONDUCTIVE PATTERN

(71) Applicant: MICRON TECHNOLOGY, INC., Boise, ID (US)

(72) Inventors: Harunobu Kondo, Akita (JP); Kazuteru Ishizuka, Yokohama (JP); Wataru Nobehara, Sagamihara (JP); Ryosuke Yatsushiro, Tama (JP); Makoto Saito, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/714,797

(22) Filed: Apr. 6, 2022

(51) Int. Cl.
*H01L 23/528* (2006.01)
*H01L 23/522* (2006.01)

(52) U.S. Cl.
CPC ...... *H01L 23/5283* (2013.01); *H01L 23/5226* (2013.01)

(58) Field of Classification Search
CPC ............. H01L 23/5283; H01L 27/0207; H01L 23/5226; H01L 23/522; H01L 27/127; H01L 23/528
See application file for complete search history.

(56) References Cited

U.S. PATENT DOCUMENTS 5,811,874 A * 9/1998 Lee .................. H01L 23/58
257/676
2012/0241969 A1* 9/2012 Okazaki .............. H01L 23/5283
257/E23.079

\* cited by examiner

*Primary Examiner* — Shih Tsun A Chou
*Assistant Examiner* — Anthony V. D'Orsaneo
(74) *Attorney, Agent, or Firm* — Dorsey & Whitney LLP

(57) ABSTRACT

Disclosed herein is an apparatus that includes a semiconductor substrate having a main surface extending in a first direction and a second direction different from the first direction and a conductive pattern formed over the main surface of the semiconductor substrate. The conductive pattern includes a first section extending in the first direction, a second section extending in the second direction, and a third section connected between the first and second sections. The third section of the conductive pattern has a first slit extending in a third direction different from the first and second directions.

19 Claims, 12 Drawing Sheets

SEMICONDUCTOR DEVICE HAVING L-SHAPED CONDUCTIVE PATTERN

BACKGROUND

There are cases where slits are formed on a wiring pattern of a semiconductor device to increase its yield ratio. However, the flow of current is at a risk of being disturbed by the slits depending on the shape of the wiring pattern.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
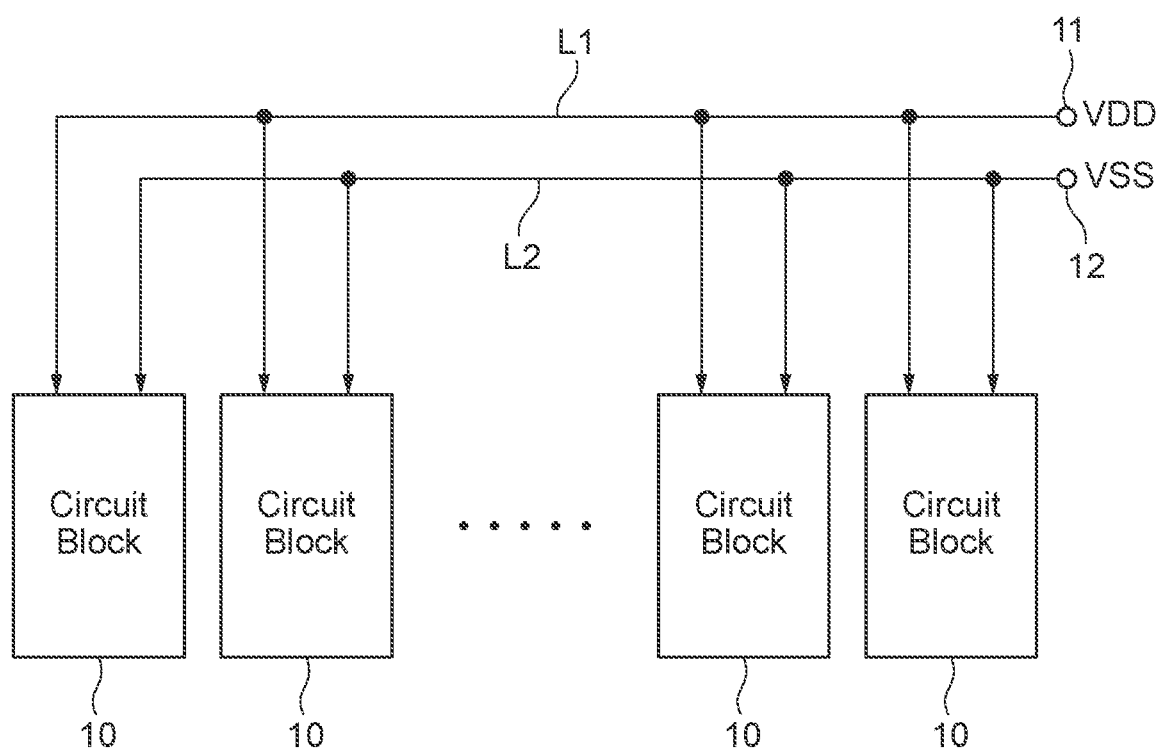
FIG. 1 is a block diagram showing a circuit configuration of a semiconductor device according to one embodiment of the present disclosure.

FIG. 1 is a block diagram showing a circuit configuration of a semiconductor device according to one embodiment of the present disclosure. The semiconductor device shown in FIG. 1 includes a plurality of circuit blocks 10, and power supply lines L1 and L2 supplying power to the circuit blocks 10. The power supply line L1 is connected to a power supply terminal 11 supplied with a power potential VDD, and supplies the power potential VDD to the circuit blocks 10. The power supply line L2 is connected to a power supply terminal 12 supplied with a ground potential VSS, and supplies the ground potential VSS to the circuit blocks 10.

Figure 2:
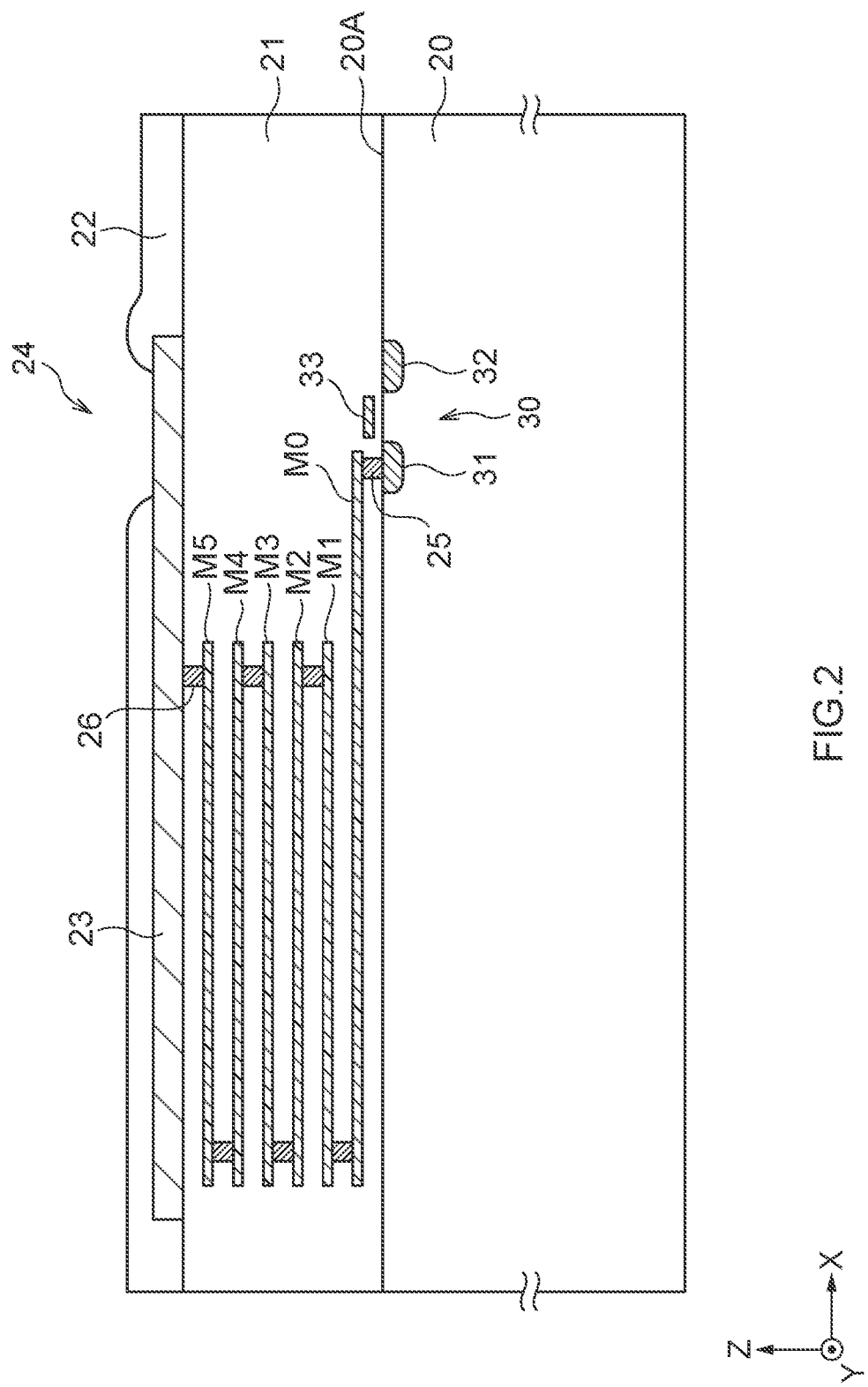
FIG. 2 is a schematic sectional view for explaining a configuration of the semiconductor device according to one embodiment of the present disclosure.
Figure 3:
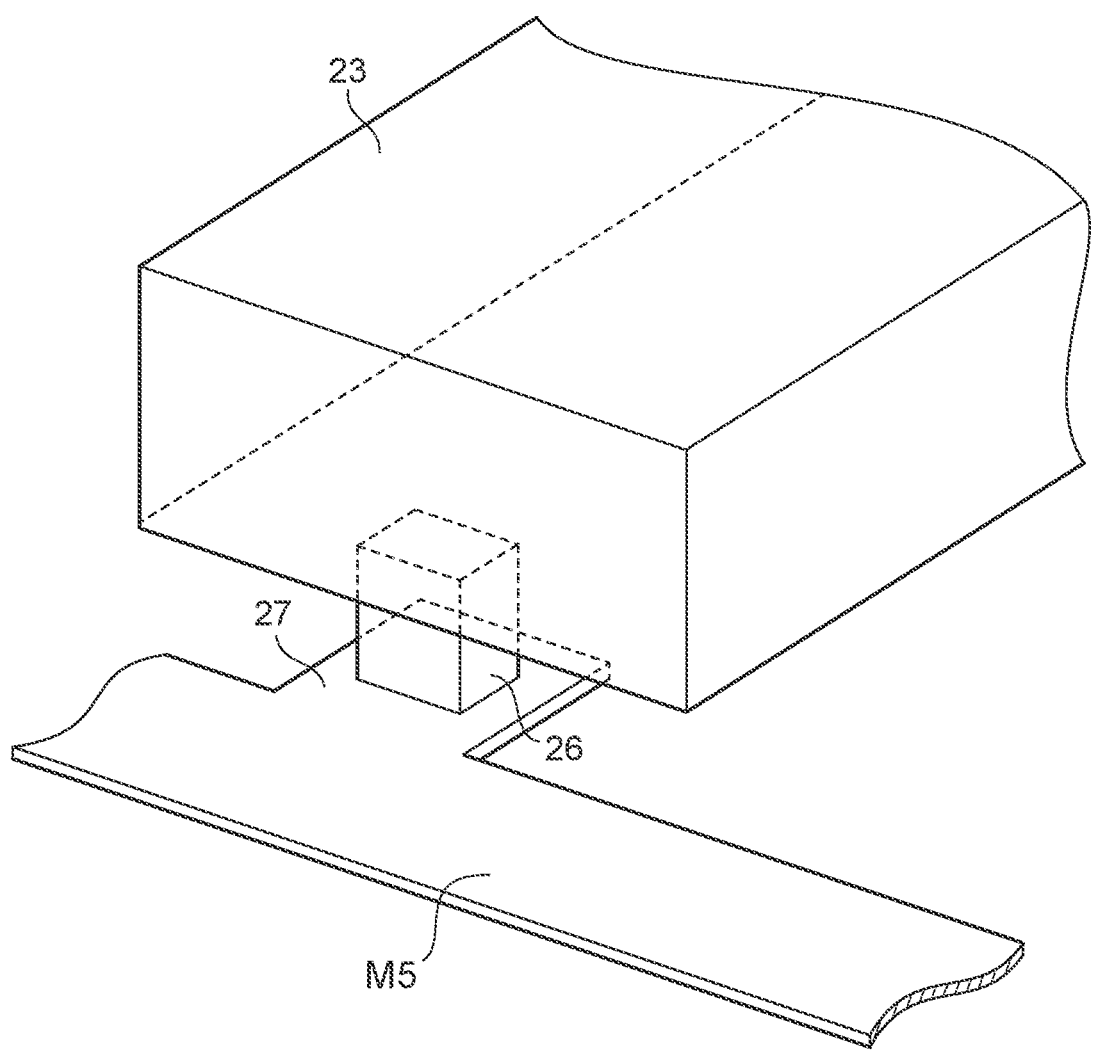
FIG. 3 is a schematic perspective view showing a part of an iRDL.

FIG. 2 is a schematic sectional view for explaining a configuration of the semiconductor device according to one embodiment of the present disclosure. As shown in FIG. 2, the semiconductor device according to the present embodiment includes a semiconductor substrate 20, and a plurality of wiring layers M0 to M5 stacked on a main surface 20A of the semiconductor substrate 20 with an interlayer dielectric film 21 interposed therebetween. The main surface 20A of the semiconductor substrate 20 constitutes an XY plane. The wiring layers M0 to M5 are stacked in a Z direction on the main surface 20A of the semiconductor substrate 20 and all extend in parallel to the main surface 20A of the semiconductor substrate 20. A transistor 30 is formed on the semiconductor substrate 20. The transistor 30 includes a source region 31, a drain region 32, and a gate electrode 33. The wiring layer M0 is positioned in a lowermost layer and a part thereof is connected to the source region 31 of the transistor 30 through a via conductor 25. The wiring layer M5 is positioned in an uppermost layer and a part thereof is connected to an iRDL (inline redistribution layer) 23 through a via conductor 26. The iRDL 23 is a rewiring layer positioned in a higher layer than the wiring layer M5 and the wiring width and wiring thickness are significantly greater than those of the wiring layer M5 as shown in FIG. 3 which is a schematic diagram. The wiring layer M5 has a pad area 27 connected to the via conductor 26. Most of the iRDL 23 is covered by a protective film 22. A part of the iRDL 23 is exposed from the protective film 22 and this part is used as an external terminal 24. Generally, the wiring widths and wiring thicknesses of the wiring layers M0 to M5 are greater in upper layers. Slits are formed on the wiring layer M5 having the greatest wiring width and wiring thickness for the purpose of reducing stress.

Figure 4:
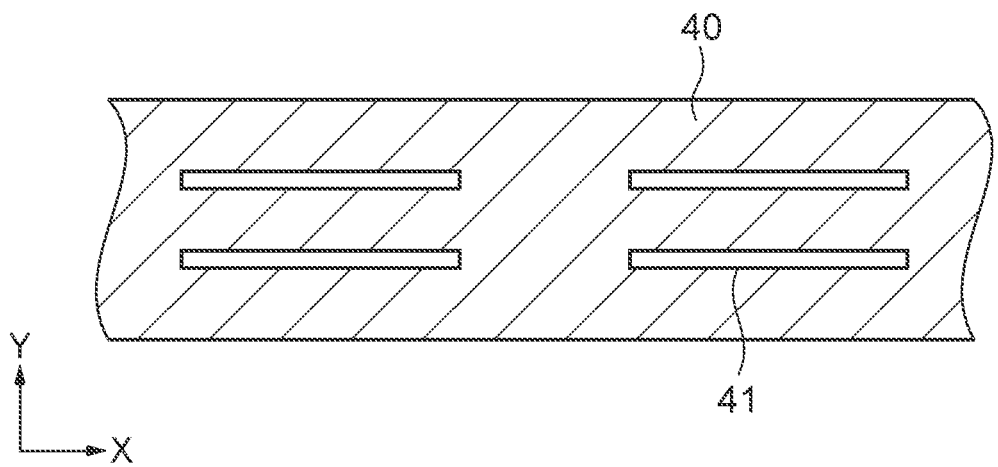
FIG. 4 is a schematic plan view of a wiring pattern extending in the X direction.
Figure 5:
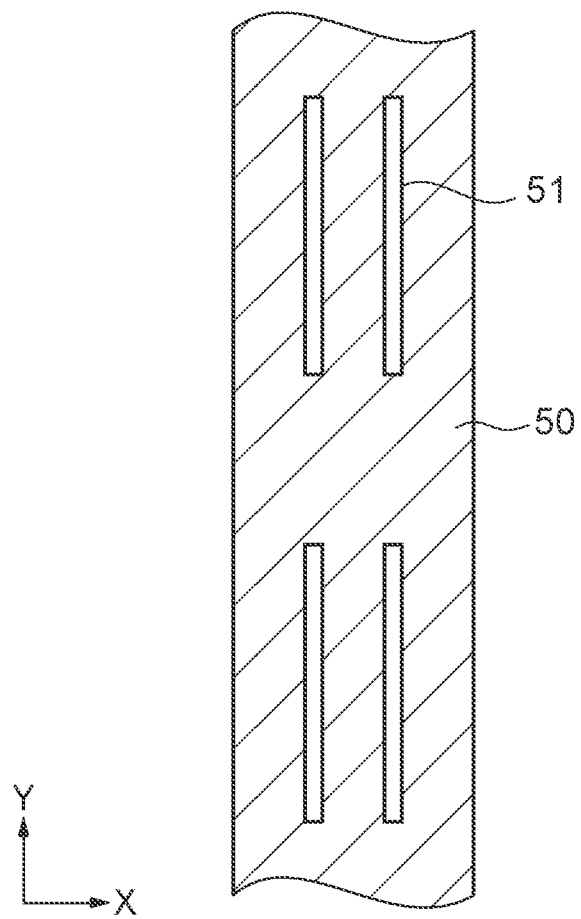
FIG. 5 is a schematic plan view of a wiring pattern extending in the Y direction.

For example, when a wiring pattern 40 located on the wiring layer M5 extends in the X direction as shown in FIG. 4, a plurality of slits 41 extending in the X direction are provided on the wiring pattern 40. When a wiring pattern 50 located on the wiring layer M5 extends in the Y direction as shown in FIG. 5, a plurality of slits 51 extending in the Y direction are formed on the wiring pattern 50. The X direction and the Y direction form an angle of 90 degrees. When slits along the extending direction of a wiring pattern are provided in this way, the flow of current is not greatly disturbed. Further, when a wiring pattern 60 located on the wiring layer M5 are crank-shaped as shown in FIG. 6, a plurality of slits are provided along the direction of the flow of current.

Figure 6:
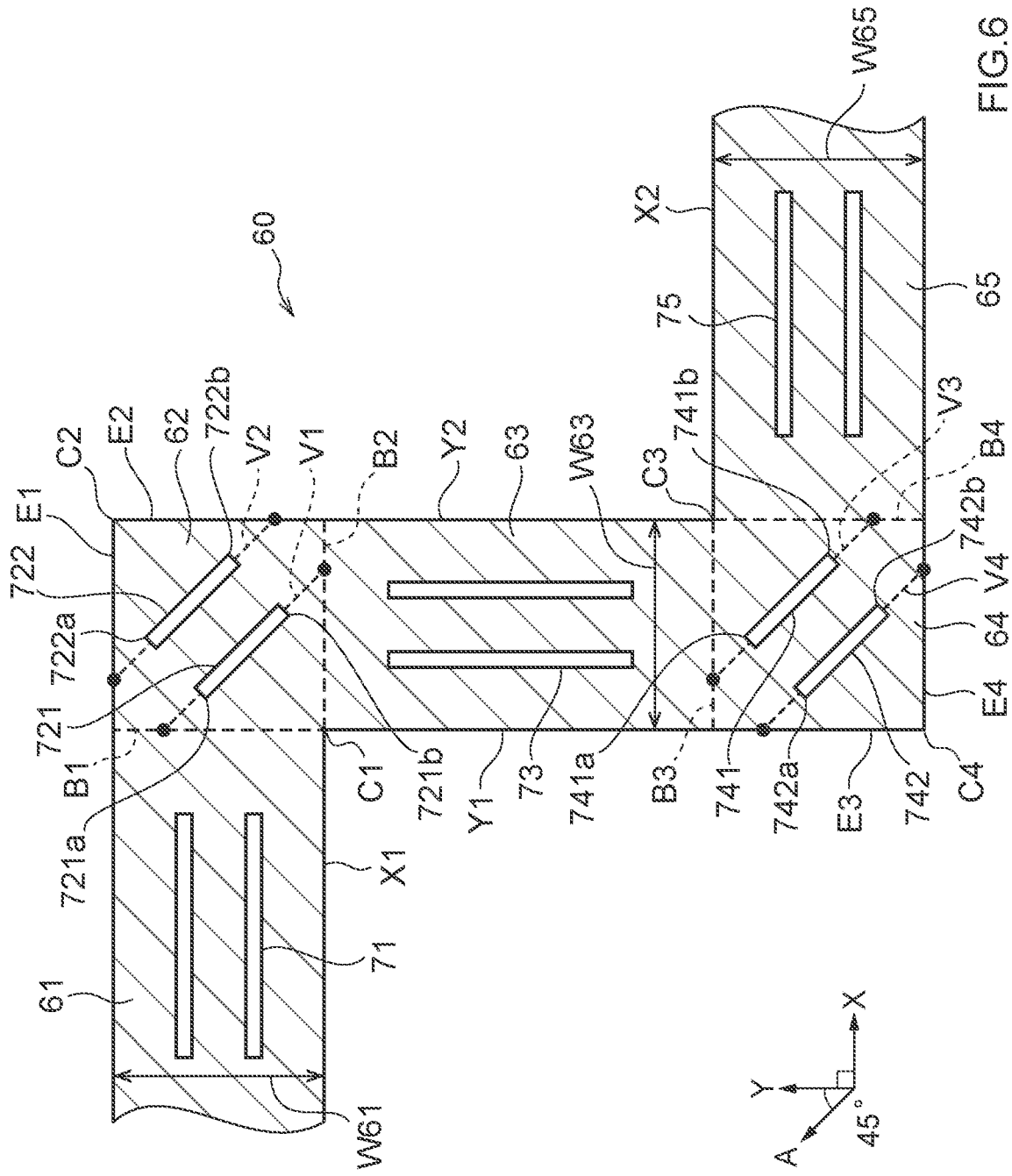
FIGS. 6 to 12 are schematic plan views of a crank-shaped wiring pattern.

The wiring pattern 60 shown in FIG. 6 includes sections 61 and 65 extending in the X direction, a section 63 extending in the Y direction, a section 62 connecting the section 61 and the section 63, and a section 64 connecting the section 63 and the section 65. In the example shown in FIG. 6, a width W61 of the section 61 in the Y direction, a width W63 of the section 63 in the X direction, and a width W65 of the section 65 in the Y direction are equal to each other. Therefore, the sections 62 and 64 are square. Although there are no physical boundaries between the sections 61 to 65, these sections are virtually defined by virtual boundaries B1 to B4. The virtual boundary B1 is a virtual boundary between the section 61 and the section 62 and is on an extended line of one edge Y1 of the section 63. The virtual boundary B2 is a virtual boundary between the section 62 and the section 63 and is on an extended line of one edge X1 of the section 61. The virtual boundary B3 is a virtual boundary between the section 63 and the section 64 and is on an extended line of one edge X2 of the section 65. The virtual boundary B4 is a virtual boundary between the section 64 and the section 65 and is on an extended line of the other edge Y2 of the section 63.

A plurality of slits 71 and 75 extending in the X direction are provided in the sections 61 and 65, respectively. A plurality of slits 73 extending in the Y direction are provided in the section 63. A plurality of slits 721 and 722 extending in an A direction are provided in the section 62. A plurality of slits 741 and 742 extending in the A direction are provided in the section 64. These slits are all completely surrounded by the wiring pattern 60 and do not communicate with an edge of the wiring pattern 60. The A direction forms an angle of 45 degrees with the X direction and the Y direction. The section 62 has an inner corner C1 at which the edge X1 and the edge Y1 terminate, and an outer corner C2 positioned diagonally to the inner corner C1. The section 64 has an inner corner C3 at which the edge X2 and the edge Y2 terminate, and an outer corner C4 positioned diagonally to the inner corner C3. The slits 721 and 722 provided in the section 62 are positioned at the side of the inner corner C1 and the side of the outer corner C2, respectively. The slits 741 and 742 provided in the section 64 are positioned at the side of the inner corner C3 and the side of the outer corner C4, respectively. The distance in the X direction between one end 721a of the slit 721 in the A direction and the virtual boundary B1 is shorter than the distance in the X direction between the other end 721b of the slit 721 in the A direction and the virtual boundary B1 while the distance in the Y direction between one end 721a of the slit 721 in the A direction and the virtual boundary B2 is longer than the distance in the Y direction between the other end 721b of the slit 721 in the A direction and the virtual boundary B2. This point is also true for the slit 722. Similarly, the distance in the Y direction between one end 741a of the slit 741 in the A direction and the virtual boundary B3 is shorter than the distance in the Y direction between the other end 741b of the slit 741 in the A direction and the virtual boundary B3 while the distance in the X direction between one end 741a of the slit 741 in the A direction and the virtual boundary B4 is longer than the distance in the X direction between the other end 741b of the slit 741 in the A direction and the virtual boundary B4. This point is also true for the slit 742.

Assuming a virtual extended line V1 extending in the A direction along the slit 721, the extended line V1 crosses both the virtual boundaries B1 and B2. Assuming a virtual extended line V2 extending in the A direction along the slit 722, the extended line V2 crosses both an edge E1 of the section 62 extending in the X direction and an edge E2 of the section 62 extending in the Y direction. Similarly, assuming a virtual extended line V3 extending in the A direction along the slit 741, the extended line V3 crosses both the virtual boundaries B3 and B4. Assuming a virtual extended line V4 extending in the A direction along the slit 724, the extended line V4 crosses both an edge E3 of the section 64 extending in the Y direction and an edge E4 of the section 64 extending in the X direction. In this way, since the slits 721, 722, 741, and 742 extend in a diagonal direction along the current direction in the sections 62 and 64 where the current direction changes by 90 degrees, the flow of current is not greatly disturbed by the slits even when the wiring pattern 60 is crank-shaped.

Figure 7:
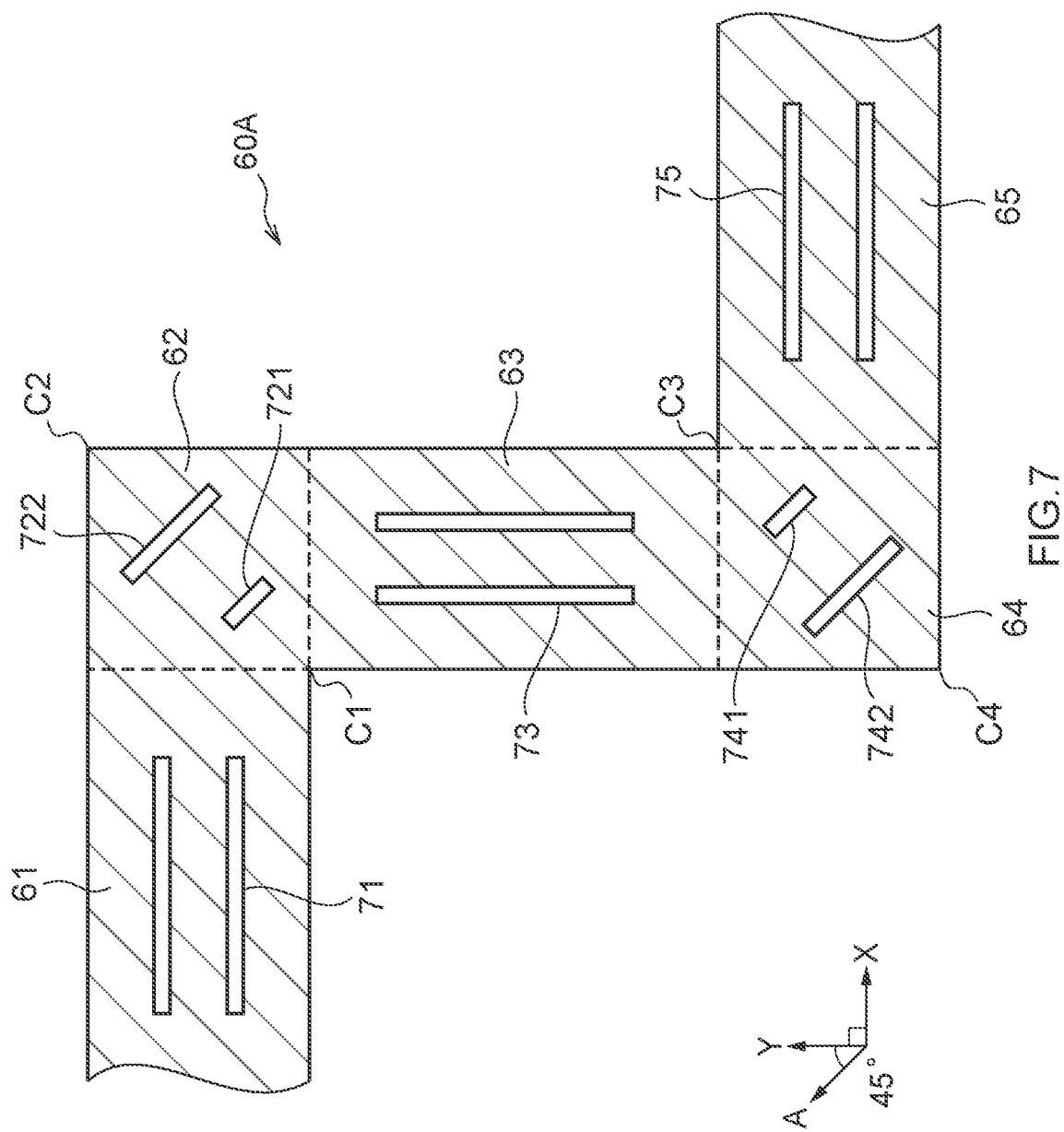
Figure 8:
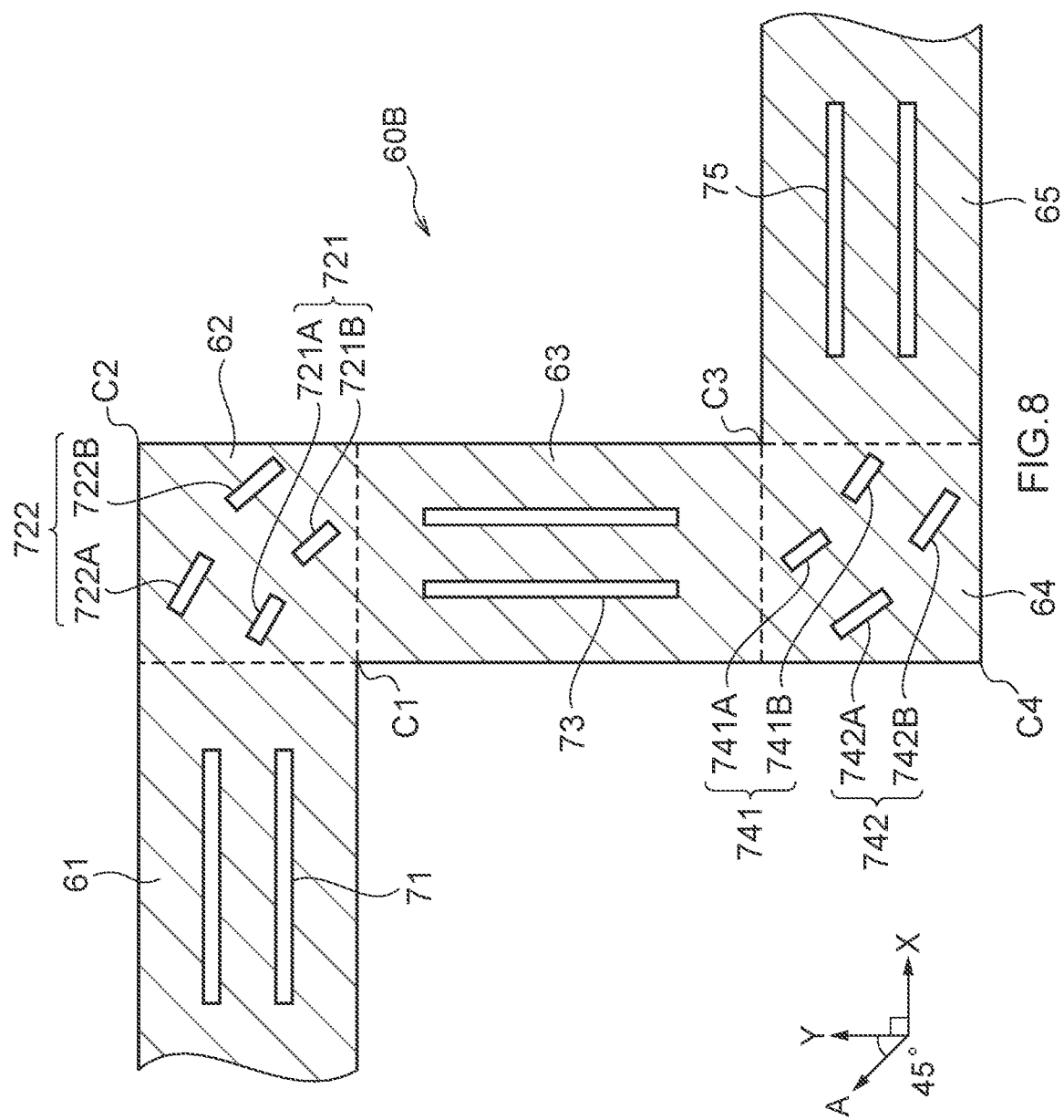
Figure 9:
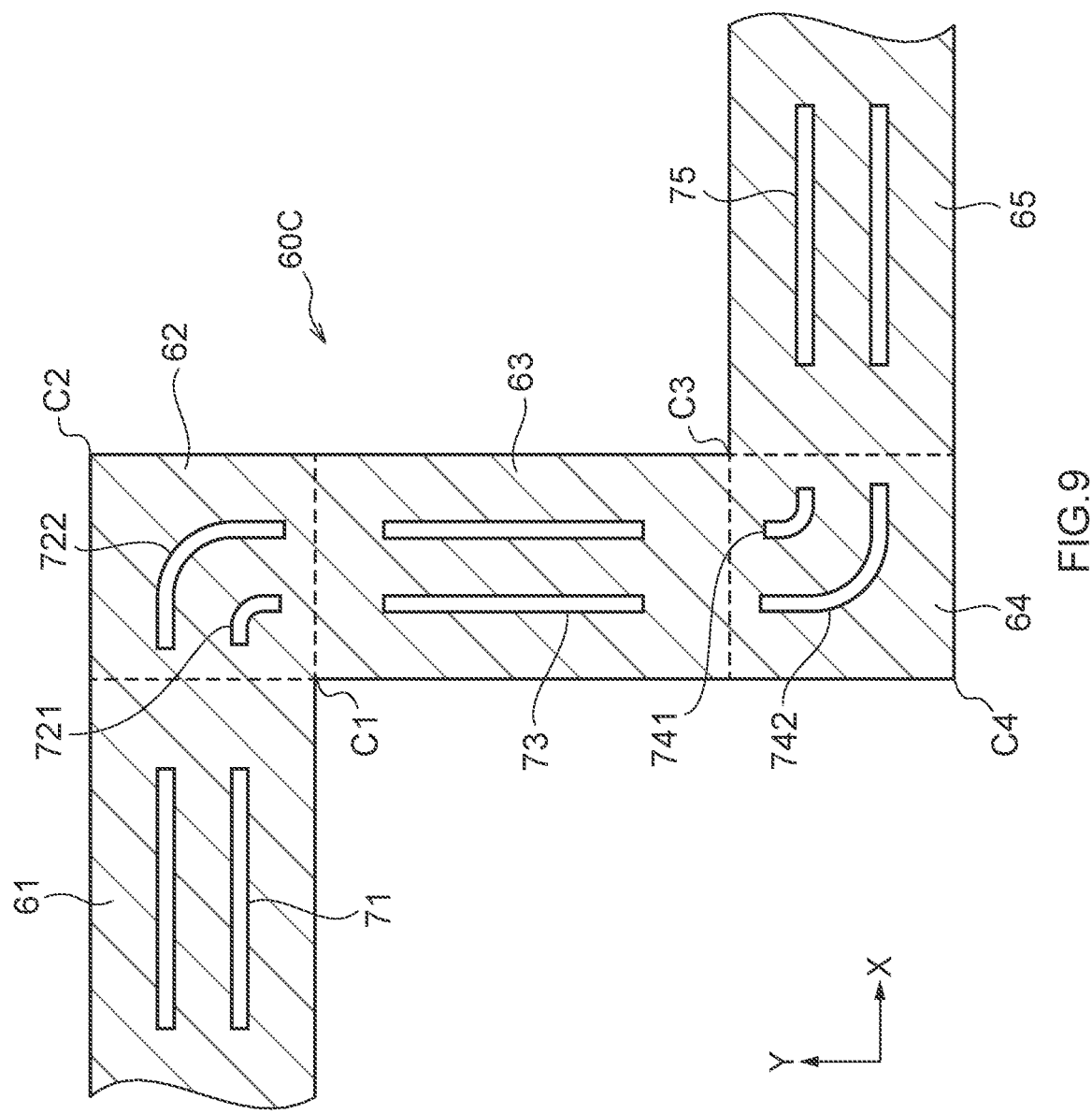

While the lengths of the slits 721, 722, 741, and 742 in the A direction are equal to each other in the example shown in FIG. 6, the lengths of the slits 721 and 741 positioned at the sides of the inner corners C1 and C3 may be shorter than those of the slits 722 and 742 positioned at the sides of the outer corners C2 and C4 as in a wiring pattern 60A shown in FIG. 7. With this configuration, the resistances of the sections 62 and 64 at the sides of the inner corners C1 and C3 where the current density is higher can be reduced. Alternatively, each of the slits 721, 722, 741, and 742 may be divided into two as in a wiring pattern 60B shown in FIG. 8. In this case, the extending directions of divided parts of each slit may be the same as each other or may be different from each other as shown in FIG. 8. In the example shown in FIG. 8, the extending directions of slits 721A and 722A positioned at the side of the section 61 are oriented slightly toward the X direction with respect to the A direction, and the extending directions of slits 721B and 722B positioned at the side of the section 63 are oriented slightly toward the Y direction with respect to the A direction. Similarly, the extending directions of the slits 741A and 742A positioned at the side of the section 63 are oriented slightly toward the Y direction with respect to the A direction, and the extending directions of the slits 741B and 742B positioned at the side of the section 65 are oriented slightly toward the X direction with respect to the A direction. The slits 721, 722, 741, and 742 may be arc-shaped along a direction in which the current flows as in a wiring pattern 60C shown in FIG. 9. In this case, the curvature radii of the slits 722 and 742 positioned at the sides of the outer corners C2 and C4 may be greater than those of the slits 721 and 741 positioned at the sides of the corners C1 and C3, respectively.

Figure 10:
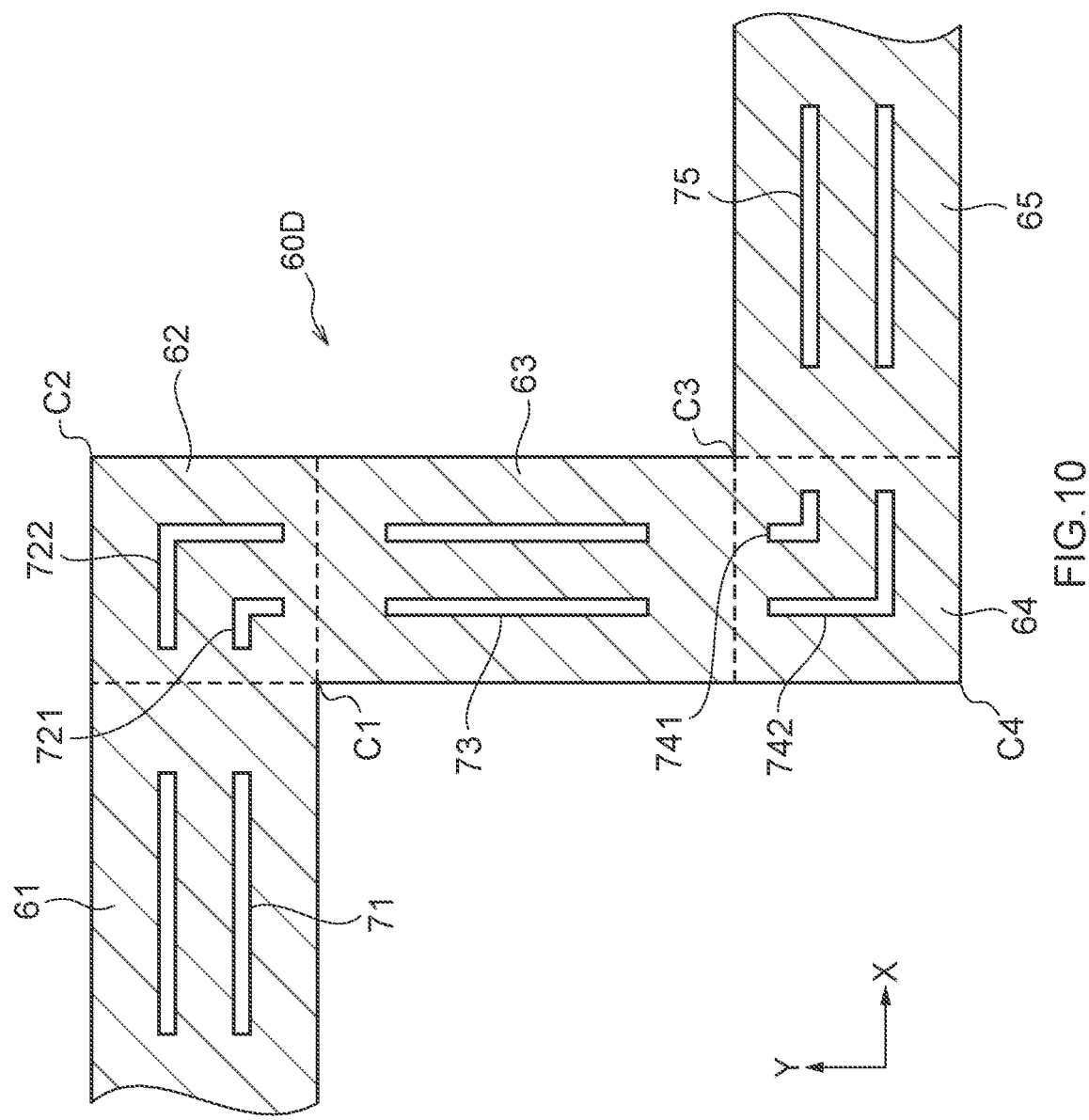
Figure 11:
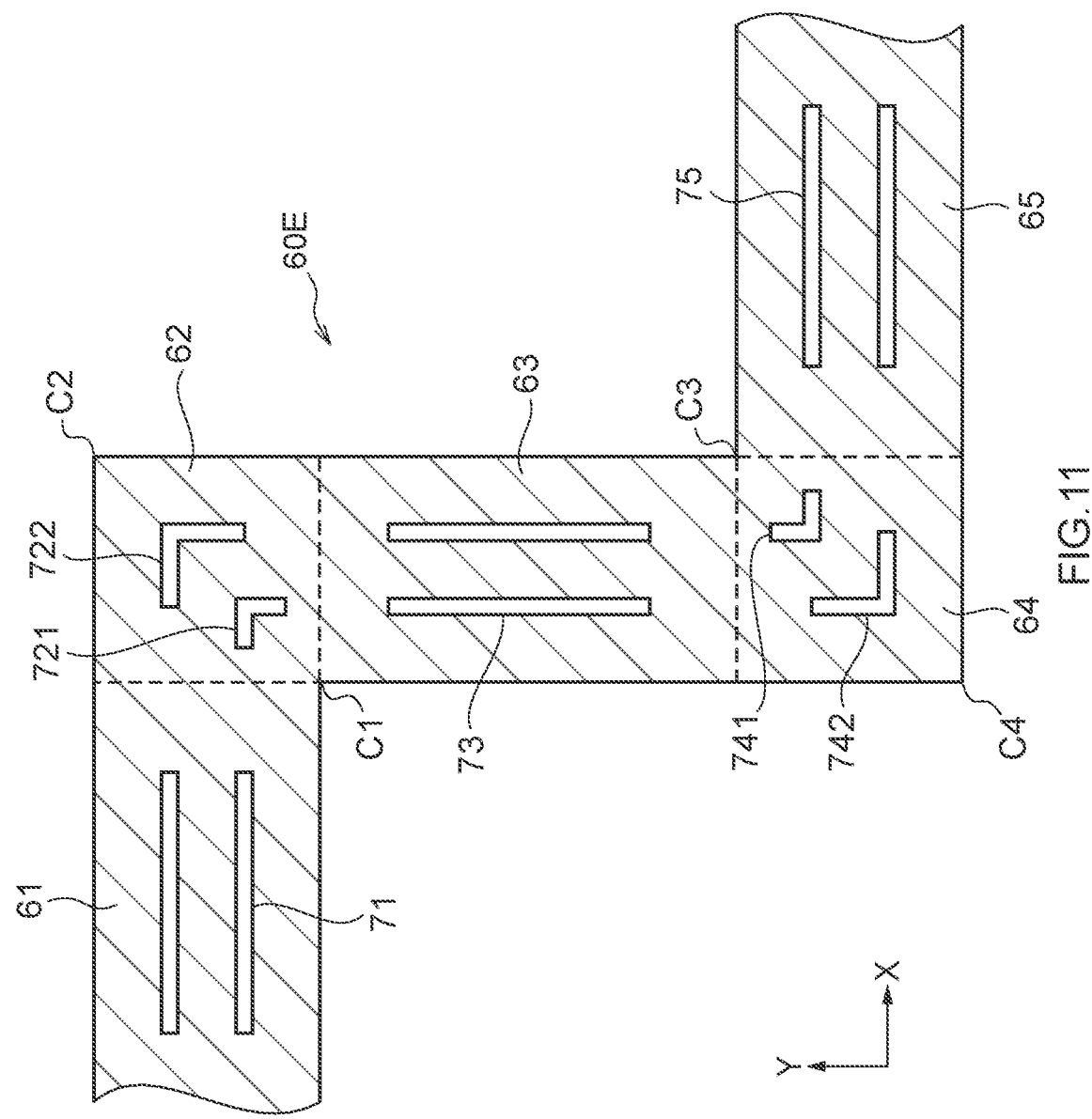

The slits 721, 722, 741, and 742 may be L-shaped along the direction in which the current flows as in a wiring pattern 60D shown in FIG. 10. In this case, the sizes of the slits 721 and 741 positioned at the sides of the inner corners C1 and C3 may be smaller than those of the slits 722 and 742 positioned at the side of the outer corners C2 and C4, respectively. In the example shown in FIG. 10, end locations of parts extending in the X direction of the slits 721 and 722 (741 and 742) are the same and end locations of parts extending in the Y direction of the slits 721 and 722 (741 and 742) are the same; however, it is also permissible that these end locations are different as in a wiring pattern 60E shown in FIG. 11.

Figure 12:
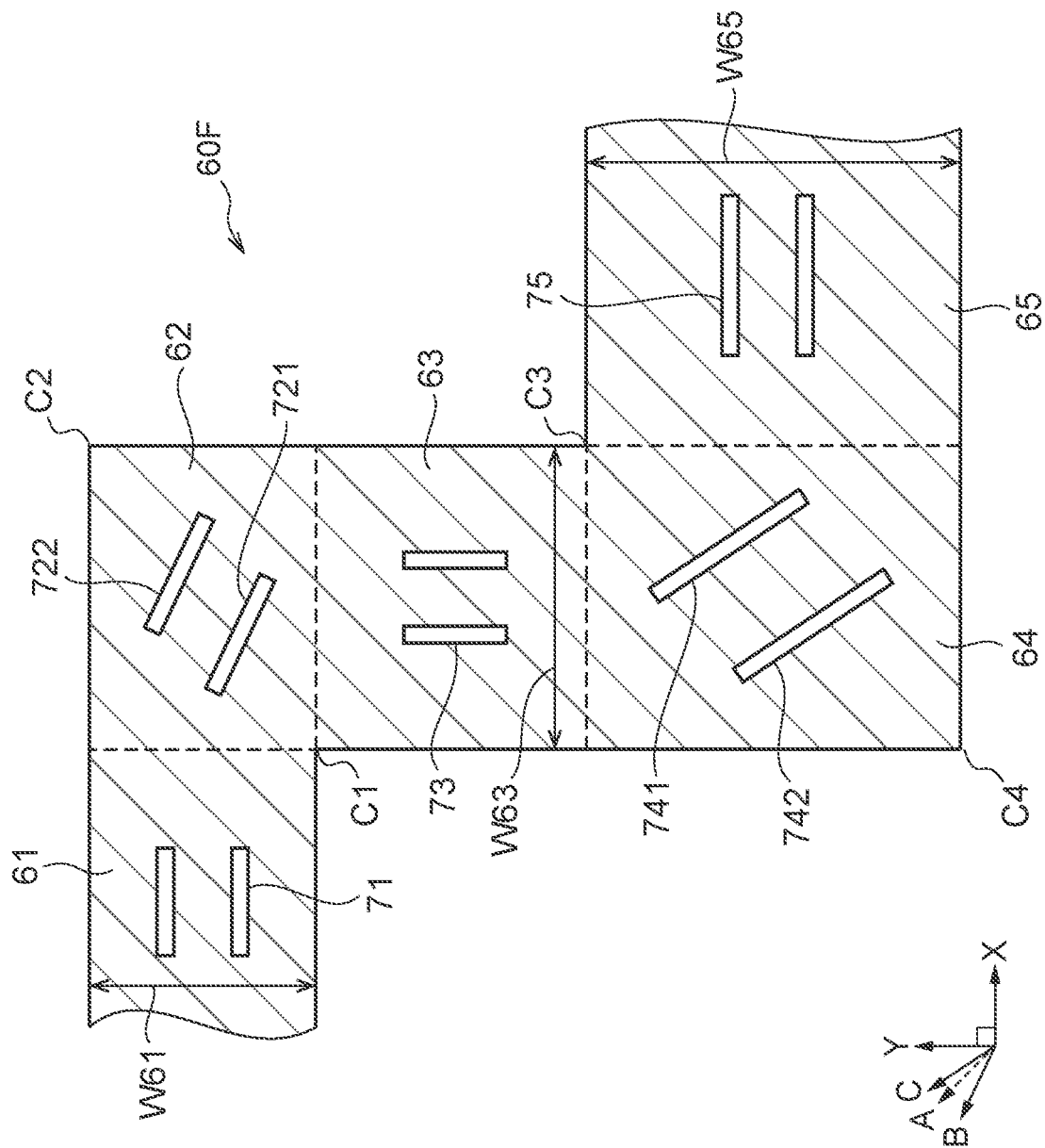

Furthermore, a width W63 of the section 63 in the X direction may be greater than a width W61 of the section 61 in the Y direction and a width W65 of the section 65 in the Y direction may be greater than the width W63 of the section 63 in the X direction as in a wiring pattern 60F shown in FIG. 12. In this case, the section 62 is a rectangle having long sides in the X direction and the section 64 is a rectangle having long sides in the Y direction. The slits 721 and 722 provided in the section 62 extend in a B direction and the slits 741 and 742 provided in the section 64 extend in a C direction as shown in FIG. 12. The B direction is inclined slightly toward the X direction with respect to the A direction, and the C direction is inclined slightly toward the Y direction with respect to the A direction. Therefore, an angle between the B direction and the X direction which is the extending direction of the section 61 is smaller than an angle between the B direction and the Y direction which is the extending direction of the section 63. An angle between the C direction and the Y direction which is the extending direction of the section 63 is smaller than an angle between the C direction and the X direction which is the extending direction of the section 65. In this way, when the sections 62 and 64 are rectangles, the flow of current is enabled to be smoother by provision of slits extending in a direction closer to the extending direction of the long sides than to the extending direction of the short sides.

Figure 13:
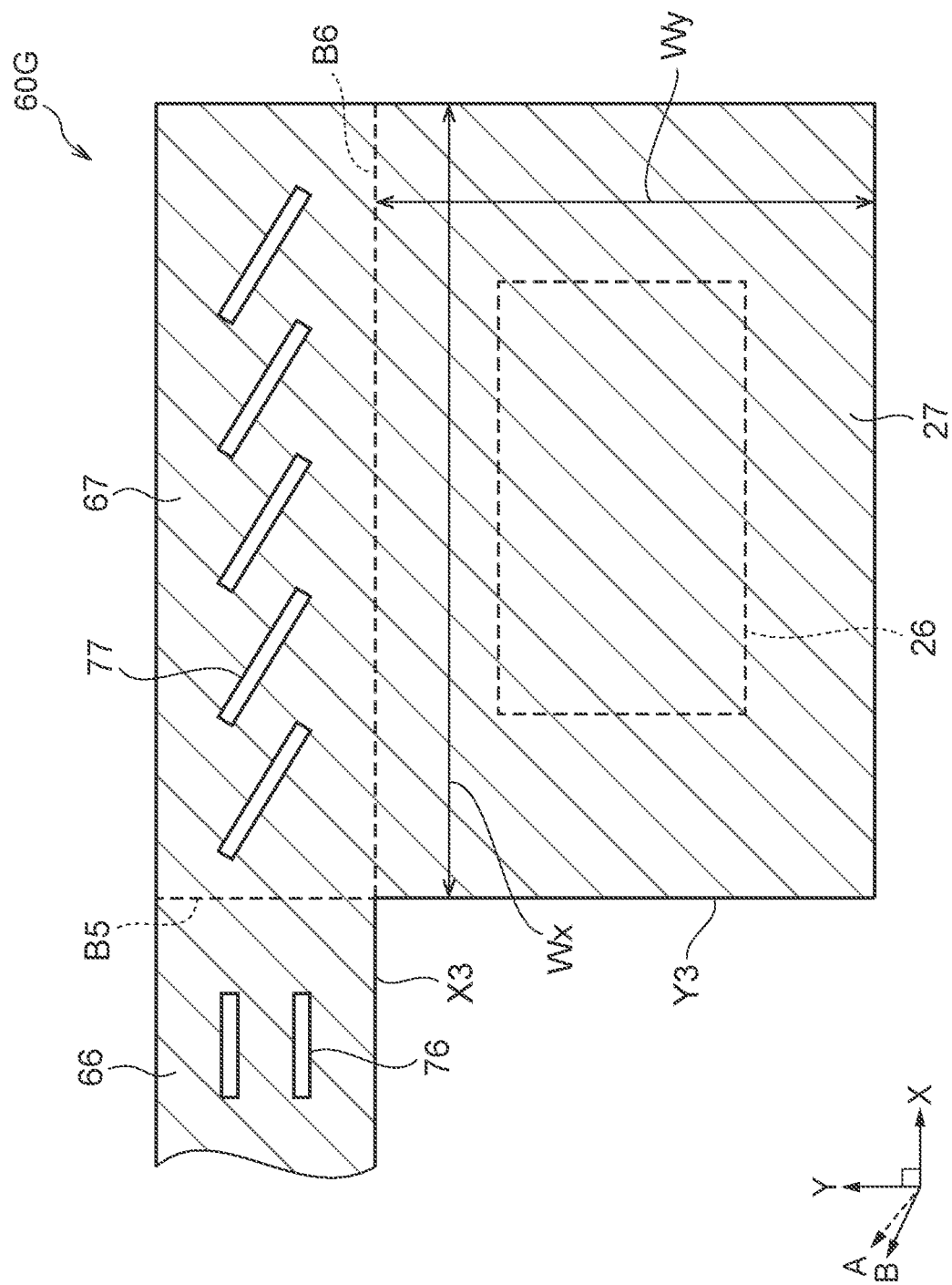
FIG. 13 is a schematic plan view of a wiring pattern including a pad area.

A wiring pattern 60G shown in FIG. 13 includes the pad area 27 connected to the via conductor 26, a section 66 extending in the X direction, and a section 67 connecting the section 66 and the pad area 27. In the example shown in FIG. 13, a width Wx of the pad area 27 in the X direction is greater than a width Wy of the pad area 27 in the Y direction. Although there are no physical boundaries between the sections 66 and 67 and the pad area 27, these are virtually defined by virtual boundaries B5 and B6. The virtual boundary B5 is a virtual boundary between the section 66 and the section 67 and is on an extended line of one edge Y3 of the pad area 27. The virtual boundary B6 is a virtual boundary between the section 67 and the pad area 27 and is on an extended line of one edge X3 of the section 66. The section 67 is a rectangle having long sides in the X direction. A plurality of slits 76 extending in the X direction are provided in the section 66 and a plurality of slits 77 extending in the B direction are provided in the section 67. No slits are provided in the pad area 27. The B direction is inclined slightly toward the X direction with respect to the A direction. In this way, the slits 77 may be provided in the section 67 connecting the pad area 27 and the section 66.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed disclosure. Thus, it is intended that the scope of at least some of the present disclosure should not be limited by the particular disclosed embodiments described above.

The invention claimed is:

1. An apparatus comprising:
a semiconductor substrate having a main surface extending in a first direction and a second direction different from the first direction; and
a conductive pattern formed over the main surface of the semiconductor substrate,
wherein the conductive pattern includes a first section extending in the first direction, a second section extending in the second direction, and a third section connected between the first and second sections, the first section having a first edge and the second section having a second edge, and the third section having an inner corner at which the first and second edges terminate and further having an outer corner positioned diagonally to the inner corner, and
wherein the third section of the conductive pattern has a first slit extending in a third direction different from the first and second directions.

2. The apparatus of claim 1, wherein the first slit is completely surrounded by the third section of the conductive pattern so as not to communicate with an edge of the conductive pattern.

3. The apparatus of claim 1, wherein the first and second directions are perpendicular to each other.

4. The apparatus of claim 3,
wherein the first slit has first and second ends opposite to each other in the third direction,
wherein the conductive pattern has a first virtual boundary defining a boundary between the first and third sections and extending in the second direction and a second virtual boundary defining a boundary between the second and third sections and extending in the first direction,
wherein a distance between the first end and the first virtual boundary is shorter than a distance between the second end and the first virtual boundary, and
wherein a distance between the second end and the second virtual boundary is shorter than a distance between the first end and the second virtual boundary.

5. The apparatus of claim 4, wherein a first virtual extended line extending in the third direction along the first slit crosses both the first and second virtual boundaries.

6. The apparatus of claim 4, wherein the third section of the conductive pattern further has a second slit extending in the third direction.

7. The apparatus of claim 6,
wherein the first slit is arranged at the inner corner side, and
wherein the second slit is arranged at the outer corner side.

8. The apparatus of claim 7, wherein lengths of first and second slits in the third direction are the same as each other.

9. The apparatus of claim 7, wherein a length of the first slit in the third direction is shorter than a length of the second slit in the third direction.

10. The apparatus of claim 6, wherein a second virtual extended line extending in the third direction along the second slit crosses both a first edge of the third section extending in the first direction and a second edge of the third section extending in the second direction.

11. The apparatus of claim 1, wherein the first slit is arc-shaped.

12. An apparatus comprising;
a semiconductor substrate having a main surface extending in a first direction and a second direction different from the first direction; and
a conductive pattern formed over the main surface of the semiconductor substrate,
wherein the conductive pattern includes a first section extending in the first direction, a second section extending in the second direction, and a third section connected between the first and second sections,
wherein the third section of the conductive pattern has a first slit extending in a third direction different from the first and second directions,
wherein a pattern width of the second section in the first direction is greater than a pattern width of the first section in the second direction, and
wherein an angle between the first and third directions is smaller than an angle between the second and third directions.

13. An apparatus comprising:
a semiconductor substrate having a main surface extending in a first direction and a second direction different from the first direction;
a conductive pattern formed over the main surface of the semiconductor substrate;
an iRDL Online redistribution layer) formed over the conductive pattern; and
a via conductor,
wherein the conductive pattern includes a first section extending in the first direction, a second section extending in the second direction, and a third section connected between the first and second sections,
wherein the third section of the conductive pattern has a first slit extending in a third direction different from the first and second directions, and
wherein the via conductor is connected between the iRDL and a fourth section of the conductive pattern.

14. An apparatus comprising:
a semiconductor substrate having a main surface extending in a first direction and a second direction perpendicular to the first direction; and
a conductive pattern formed over the main surface of the semiconductor substrate, wherein the conductive pattern includes first and second sections extending in the first direction, a third section extending in the second direction, a fourth section connected between the first section and one end of the third section, and a fifth section connected between the second section and other end of the third section, wherein the fourth section of the conductive pattern has a first slit extending in a third direction different from the first and second directions, wherein the fifth section of the conductive pattern has a second slit extending in a fourth direction different from the first and second directions, and wherein a pattern width of the third section in the first direction is greater than a pattern width of the first section in the second direction.

15. The apparatus of claim 14, wherein a pattern width of the second section in the second direction is greater than the pattern width of the third section in the first direction.

16. The apparatus of claim 15, wherein an angle between the first and third directions is smaller than an angle between the second and third directions, and wherein an angle between the second and fourth directions is smaller than an angle between the first and fourth directions.

17. An apparatus comprising;

a semiconductor substrate having a main surface extending in a first direction and a second direction different from the first direction; and a conductive pattern formed over the main surface of the semiconductor substrate, wherein the conductive pattern includes a first section extending in the first direction, a second section extending in the second direction, and a third section connected between the first and second sections, the first section having a first edge and the second section having a second edge, and the third section having an inner corner at which the first and second edges terminate and further having an outer corner positioned diagonally to the inner corner, and wherein the third section of the conductive pattern has a first L-shaped slit extending in the first and second directions.

18. The apparatus of claim 17, wherein the third section of the conductive pattern further has a second L-shaped slit extending in the first and second directions.

19. The apparatus of claim 18, wherein the second L-shaped slit is greater in size than the first L-shaped slit, wherein the first L-shaped slit is arranged at the inner corner side, and wherein the second L-shaped slit is arranged at the outer corner side.

* * * * *

UNITED STATES PATENT AND TRADEMARK OFFICE
CERTIFICATE OF CORRECTION

PATENT NO. : 11,764,152 B1
APPLICATION NO. : 17/714797
DATED : September 19, 2023
INVENTOR(S) : Harunobu Kondo et al.

It is certified that error appears in the above-identified patent and that said Letters Patent is hereby corrected as shown below:

In the Claims

| | Reads | Should Read |
|---|---|---|
| Column 6, Line 50, Claim 13 | "an iRDL Online redistribution layer)" | --an iRDL (inline redistribution layer)-- |

Signed and Sealed this
Twenty-seventh Day of February, 2024

*Katherine Kelly Vidal*
Director of the United States Patent and Trademark Office